United States Patent [19]
Kovacs

[11] Patent Number: 5,638,393
[45] Date of Patent: Jun. 10, 1997

[54] NONMONOLITHIC MULTIPLE LASER SOURCE ARRAYS

[75] Inventor: Gregory J. Kovacs, Mississauga, Canada

[73] Assignee: Xerox Corporation, Stamford, Conn.

[21] Appl. No.: 350,536

[22] Filed: Dec. 7, 1994

[51] Int. Cl.⁶ ............................ H01S 3/103; H01S 3/19; B41J 2/45
[52] U.S. Cl. ...................... 372/50; 372/46; 372/23; 372/27; 347/238
[58] Field of Search ...................... 372/23, 24, 27, 372/45, 46, 50, 47–49, 97; 346/1.1, 108; 347/238, 232, 115, 117, 118, 119, 130

[56] References Cited

U.S. PATENT DOCUMENTS

| | | | |
|---|---|---|---|
| 4,474,422 | 10/1984 | Kitamura | 350/6.8 |
| 4,674,095 | 6/1987 | Heinen et al. | 372/50 |
| 4,786,918 | 11/1988 | Thornton et al. | 372/46 |
| 4,813,762 | 3/1989 | Leger et al. | 372/44 |
| 4,901,325 | 2/1990 | Kato et al. | 372/44 |
| 4,916,710 | 4/1990 | Hattori | 372/50 |
| 4,962,312 | 10/1990 | Matuura et al. | 250/236 |
| 5,115,285 | 5/1992 | Menigaux et al. | 357/17 |
| 5,170,180 | 12/1992 | Doi | 346/107 R |
| 5,243,359 | 9/1993 | Fisli | 346/1.1 |
| 5,373,174 | 12/1994 | Yamamoto | 257/88 |
| 5,373,313 | 12/1994 | Kovacs | 346/157 |
| 5,404,372 | 4/1995 | Phillips, Jr. | 372/50 |
| 5,412,678 | 5/1995 | Treat et al. | 372/45 |

FOREIGN PATENT DOCUMENTS

| | | | |
|---|---|---|---|
| 1-53488 | 3/1989 | Japan | 372/50 |
| 5-110187 | 4/1993 | Japan | 372/50 |

*Primary Examiner*—Rodney B. Bovernick
*Assistant Examiner*—Hemang Sanghavi

[57] ABSTRACT

An array of laser diodes produces laser beams having an orthogonal polarization and/or a different wavelength. A plurality of aligned, monolithic laser beam dies are mounted on a base so that the laser beams have a relatively close, predetermined beam offset. A special metallization pattern connects laser stripes on the laser beam dies to ball bonding locations. Wire bonds are then connected to each of the ball bonding locations.

22 Claims, 3 Drawing Sheets

NONMONOLITHIC MULTIPLE LASER SOURCE ARRAYS

FIELD OF THE INVENTION

The present invention relates to laser diode arrays, and in particular, to laser diode arrays having multiple laser sources that produce closely spaced beams, preferably having different wavelengths and/or different polarizations.

BACKGROUND OF THE INVENTION

Flying spot scanners, often referred to as raster output scanners (ROS), conventionally have a reflective multi-faceted polygon mirror that is rotated about its central axis to repeatedly sweep one or more intensity modulated beams of light across a photosensitive recording medium in a line scanning direction (also known as the fast-scan direction) while the recording medium is being advanced in an orthogonal, or process, direction (also known as the slow-scan direction) such that the beams scan the recording medium in accordance with a raster scanning pattern. Digital printing is performed by serially intensity modulating each of the beams in accordance with a binary sample string, whereby the recording medium is exposed to the image represented by the samples as it is being scanned.

Laser arrays of multiple wavelength sources have many important applications. For example, a color xerographic printer that uses four different wavelength beams can have significantly higher throughput than a color xerographic printer that uses only one laser beam. This is so because a four wavelength laser printer can produce overlapping beams, sweep those beams using a single raster output polygon scanner and a single set of optics, subsequently separate the individual beams using wavelength selective filters, and direct each beam onto a separate xerographic imaging station. A latent image for each wavelength is then developed and a full color image is obtained by transferring the developed images onto a single recording medium. Such a system is derscribed in U.S. Pat. No. 5,243,359 to Fisli. In another application, multiple wavelength overlapping beams are imaged without separation at a single imaging station. Once again, the multiple beams allow higher throughput than a single beam. Such a system is described in U.S. Pat. No. 5,373,313 to Kovacs.

A diode laser package with closely spaced emitters would allow a single set of optics to be used, and would eliminate the need for beam combining optics. However, the individual laser diodes in such a package should be closely spaced (preferably spaced as close as 50 μm) to avoid off-axis distortion effects as the beams propagate through the optical system.

While multiple wavelength laser sources are advantageous, the use of multiple wavelengths creates its own set of problems. For example, the focal length of a laser beam through a given set of optics is wavelength dependent. Thus, if a single set of optics is used in a multiple wavelength system, the different wavelength laser beams will have different focal lengths. In a printer, different focal lengths will result in multiple focal planes for the imaged spots if all laser beams emanate from the same plane. Different focal positions can cause various registration problems which are highly undesirable.

Both ROS and multi-beam printer techniques are illustrated in U.S. Pat. No. 4,474,422 to Kitamura, the disclosure of which is incorporated herein by reference. In the Kitamura patent, multiple laser sources are arranged diagonally (see FIG. 10b of the Kitamura patent) to sweep multiple beams across a single photoreceptor. The beams are also displaced from each other in the cross-scan direction so that multiple lines can be scanned simultaneously across the photoreceptor. An object of the Kitamura patent is to reduce variations in pitch by spacing individual laser sources within the laser array closely in a compact structure.

Commonly assigned U.S. Pat. No. 5,243,359 to Fisli, the disclosure of which is incorporated herein by reference in its entirety, discloses a ROS system suitable for deflecting multiple laser beams in a multi-station printer. In the Fisli patent, the rotating polygon mirror simultaneously deflects a plurality of clustered, dissimilar wavelength laser beams having their largest divergence angles parallel to one another. The reflected laser beams are subsequently separated by a plurality of optical filters and directed to their associated imaging stations. Similarly dimensioned spots are obtained on each photoreceptor by establishing similar path lengths for each beam. This is facilitated by locating all lasers in one integral unit. The laser diodes are arranged in a line in a cross-scan direction (sagitally offset), i.e., parallel to the axis of rotation of the polygon mirror.

Commonly assigned U.S. patent application Ser. No. 07/948,530, to Thomas L. Paoli, the disclosure of which is incorporated herein by reference in its entirety, discloses a ROS system in which the rotating polygon mirror simultaneously deflects a plurality of orthogonally polarized and dissimilar wavelength laser beams having their largest divergence angles parallel to one another that are subsequently separated by a polarized beam separator and a plurality of dichroic beam separators and directed to their associated imaging stations. Similarly dimensioned spots are obtained on each photoreceptor by establishing similar path lengths for each beam. This is facilitated by locating all lasers in one integral unit. The laser diodes are arranged in a line in a cross-scan direction (i.e., they are sagittally offset) and must be fabricated such that they are packed closely together in a direction parallel to the polygon mirror rotation axis to minimize beam characteristic deviations such as spot size, energy uniformity, bow and linearity. That is, the laser diodes are kept as close together as possible in the cross-scan direction so that the light beams strike as nearly the same portion of the polygon mirror as possible.

Commonly assigned, U.S. patent application Ser. No. 08/156,219 entitled "Offset Mounting of Nonmonolithic Multiwavelength Lasers" to Kovacs et al., the disclosure of which is incorporated herein by reference in its entirety, discloses a ROS architecture in which the laser diodes produce laser beams of different wavelengths that are axially displaced from one another. The laser producing the beam having the shortest wavelength is closest to the Fθ scan lens to create common focus of the beams on separate photoreceptors.

In U.S. patent application Ser. No. 08/156,219, a thermally conductive spacer is used to join two laser mounting surfaces, wherein the width of the spacer controls the separation of the laser mounting surfaces.

Commonly assigned U.S. patent application Ser. No. 08/156,222 to Kovacs et al., entitled "Laser Diode Arrays With Close Beam Offsets", discloses mounting a first and a second monolithic laser diode on a submount so that the laser stripes of the first and second laser diodes have close beam offsets. As shown in FIG. 7 of U.S. patent application Ser. No. 08/156,222, this allows alignment of two laser diodes on a submount with a close beam offset. However, U.S. patent application Ser. No. 08/156,222 does not disclose alignment in the same plane of more than two laser diodes all having a close beam offset.

With certain raster output scanner designs that use multibeam laser sources coupled with beam splitting techniques to address multiple xerographic stations, four aligned beams having a sagittal separation with a close offset between the beams are used. The beams may be of four different wavelengths. Alternatively, the beams may be of two wavelengths with one of the beams of each of the two wavelengths having a different polarization from the other beam of the same wavelength.

Laser diode arrays are generally of two different varieties: monolithic and nonmonolithic. Monolithic arrays of laser diodes are arrays of laser stripes (i.e. layers of materials that lase when an electric current runs through them) that are produced as a unitary structure in the manufacturing process. By contrast, nonmonolithic arrays are structures that are not constructed as unitary arrays. Instead, a nonmonolithic array usually comprises a separate submount and a plurality of separate laser diodes that are coupled to the submount in some fashion such as solder, epoxy, or the like.

A problem with the monolithic approach is that there is a reduction of yield associated with each additional laser source because a separate regrowth step is required to produce each additional laser source. Thus, a four laser source array would require three regrowth steps, resulting in a relatively low yield. Fabricating a four laser source array using four separate laser diodes is labor intensive. It also is difficult to achieve the desired minimal spacing between laser sources when using four separate laser diodes.

Accordingly, there is a need for a laser array having four aligned, accurately and closely spaced lasers.

SUMMARY OF THE INVENTION

In order to achieve the above and other objects, and to overcome the shortcomings set forth above, a laser array that emits four closely spaced laser beams is produced from two monolithic laser dies, each of which produces two laser beams (each monolithic die also can be referred to as a dualbeam die). Each dualbeam die is produced from laser wafers or chips which have undergone a side-by-side regrowth process or other process for producing a dualbeam chip that is processed to generate two closely spaced laser stripes. Each dualbeam die includes two laser stripes, each of which generates a laser beam. The stripes on each dualbeam die are closely spaced, for example by 50 µm. One stripe on each dualbeam die (an edgemost stripe) is located closely adjacent to an edge of the die. This can be accomplished by dicing one side of the die parallel to the edgemost stripe so that the edgemost stripe is in close proximity to the edge of the die. Each die is then mounted on a base, such as, for example, a heatsink, so that the edges of each die having the edgemost stripe are adjacent to each other. This enables the edgemost stripes on adjacent dies to be located close to each other, for example 50 µm from each other.

The above process results in a laser array having four laser sources (laser stripes) arranged in a line and spaced from each other by a small amount, e.g., 50 µm. The laser array can be arranged in a printing device so that the line of laser sources extends in the sagittal direction (i.e., parallel to the axis about which a polygon mirror rotates) so that the laser sources are spaced from one another in the sagittal direction.

Preferably, the laser sources are fabricated so that their laser beams can be separated from one another by wavelength and/or polarization. In one embodiment, each laser source outputs a laser beam having a distinct wavelength. In another embodiment, a first pair of laser sources produce beams having a common wavelength but different polarizations, while a second pair of laser sources produces a second pair of light beams having a common wavelength that is different from the wavelength of the first pair. The second pair of light beams also have different polarizations.

A special metallization pattern can be provided on each monolithic, dualbeam chip to enable the closely spaced stripes thereon to be separately addressed after cleaving and dicing into dies while still locating one of the stripes in close proximity to an edge of its die.

BRIEF DESCRIPTION OF THE DRAWINGS

The above and further objects and advantages of the present invention will become clear from the following description of preferred embodiments taken in conjunction with the following drawings, in which like reference numerals refer to like elements, and wherein.

DETAILED DESCRIPTION OF PREFERRED EMBODIMENTS

While this invention is described in detail herein with specific reference to certain illustrated embodiments, it is to be understood that there is no intent to be limited to those embodiments. On the contrary, the aim is to cover all modifications, alternatives, and equivalents falling within the spirit and scope of the invention as defined by the following claims. For example, the invention is applicable to all types of printing devices that use four or more closely spaced laser beams produced from a plurality of dies each containing monolithic dualbeam laser stripes, each die therfore producing two laser beams. Such printing devices include facsimile machines, copiers, printers, etc. The illustrated embodiments direct each laser beam to separate imaging surfaces that are separate photoconductive drums or belts. However, the invention also is applicable to printing devices that use a single imaging surface to receive multiple scanned laser beams.

Figure 1:
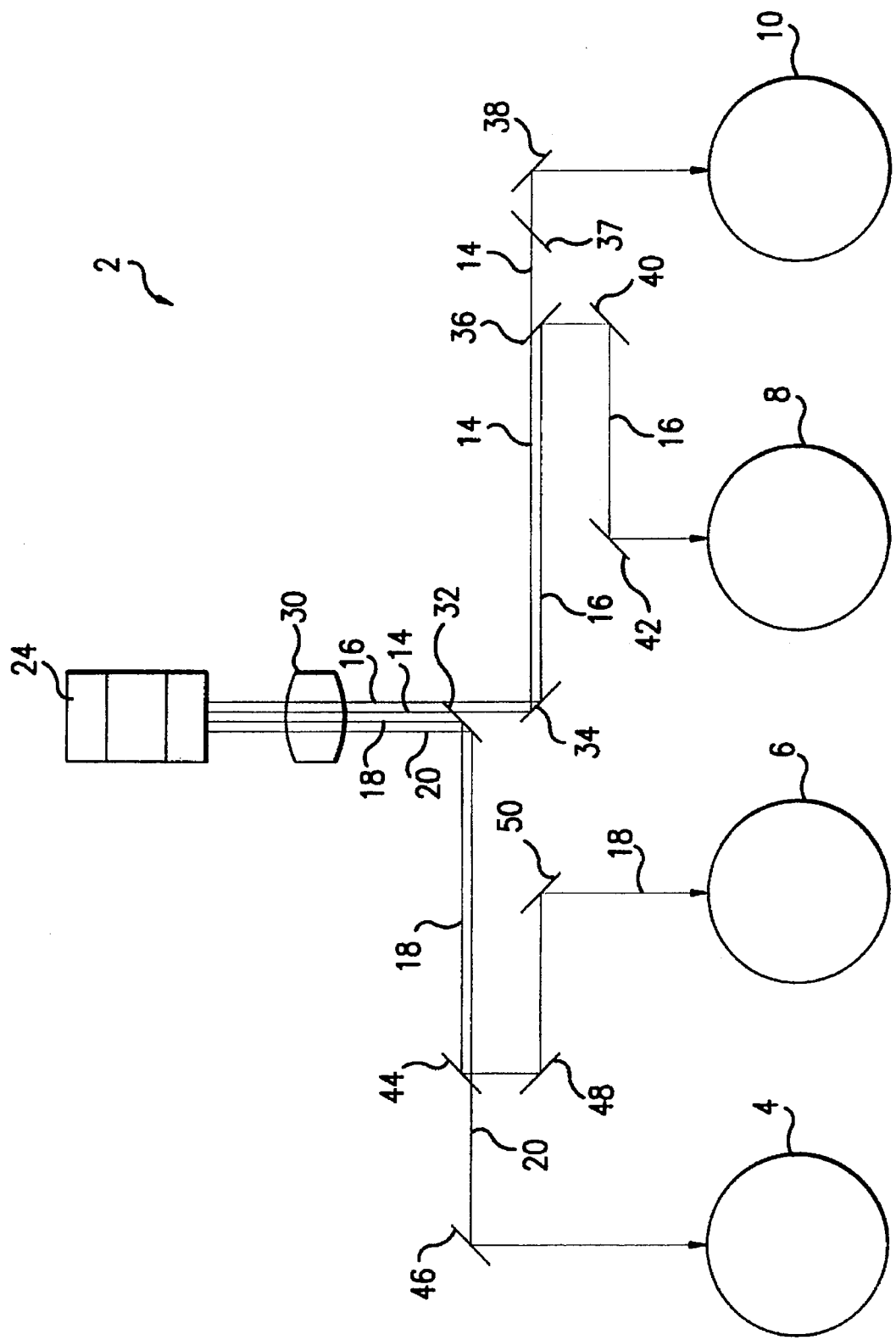
FIG. 1 is a simplified, schematic view illustrating a raster output scanner system that uses a laser array in accordance with the principles of the present invention.

In FIG. 1, a multistation color printing device 2 that has four photoreceptors 4, 6, 8 and 10 is illustrated. In the printing device 2, four bundled, parallel and dissimilar wavelength modulated laser beams 14, 16, 18 and 20 are swept by a single rotating polygon mirror 24. For example, the laser beams 14, 16, 18, 20 may have wavelengths of 645 nm, 755 nm, 695 nm, and 825 nm, respectively. The swept beams are input into a single set of imaging and correction optics 30 (e.g., an fθ scan lens). The correction optics 30 focuses the beams and corrects for errors such as polygon angle error and wobble.

The four laser beams from the imaging correction optics 30 are input to a first optical filter 32, which may be a dichroic mirror (wavelength-selective beam splitter) comprised of a wavelength selective, multi-layer film that passes laser beams 14 and 16, but reflects laser beams 18 and 20.

The passed laser beams 14 and 16 reflect off first mirror 34 onto a second optical filter 36. The second optical filter 36 passes laser beam 14 and reflects laser beam 16. The laser beam 14 then reflects from a second mirror 38 onto photoreceptor 10, while the laser beam 16 reflects from a third mirror 40 and a fourth mirror 42 onto photoreceptor 8.

From the first optical filter 32, laser beams 18 and 20 are input to a third optical filter 44. The third optical filter 44 passes laser beam 20 and reflects laser beam 18. The laser beam 20 then reflects from a fifth mirror 46 onto photoreceptor 4, while the laser beam 18 reflects from a sixth mirror 48 and a seventh mirror 50 onto photoreceptor 6.

Figure 2:
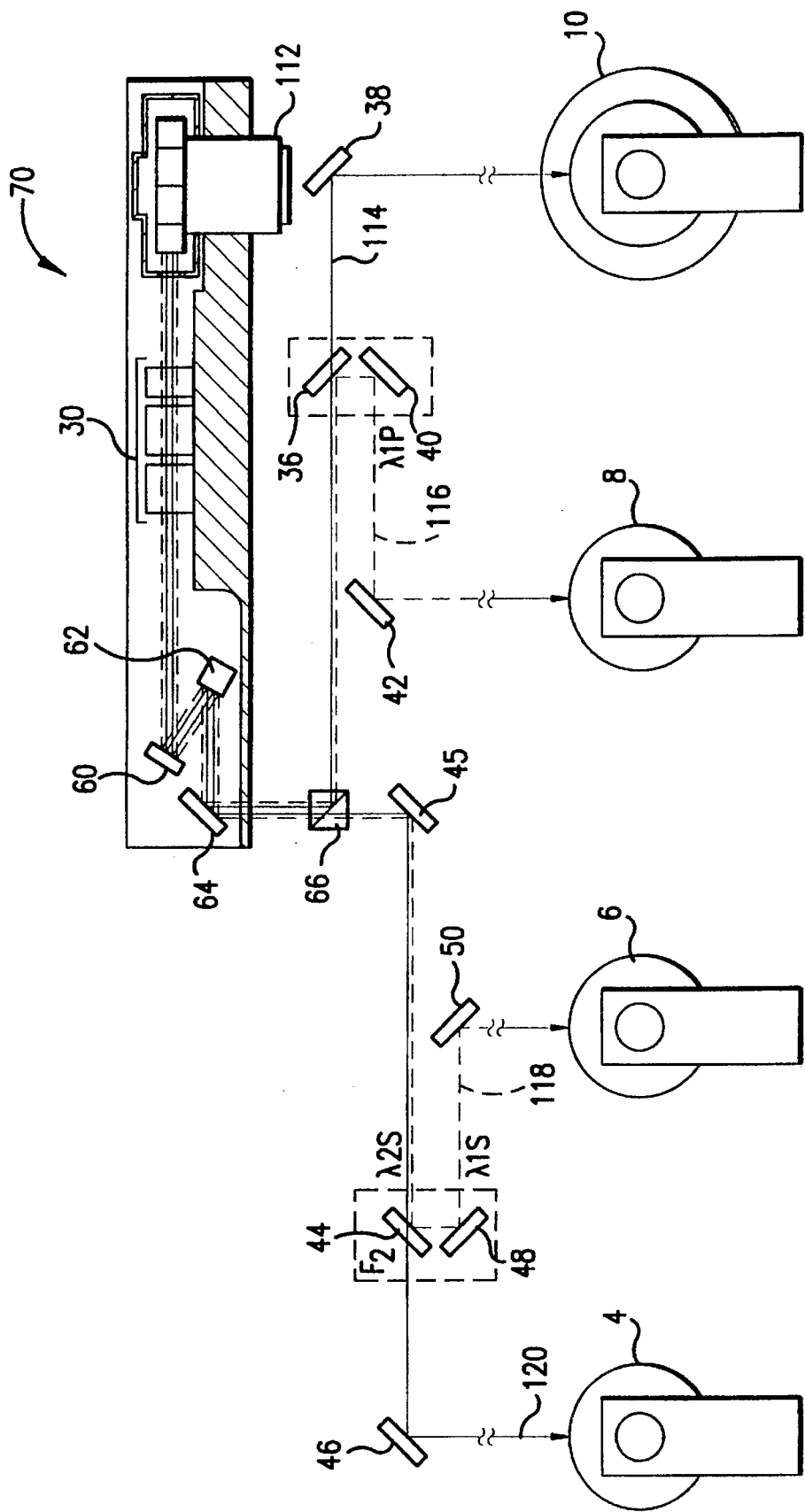
FIG. 2 is a simplified, schematic view that illustrates a second raster output scanner system that uses a laser array in accordance with the principles of the present invention.

An alternative embodiment printing device 70, in which laser arrays in accordance with the present invention may be effectively used, is illustrated in FIG. 2. The printing device 70 produces two pairs of laser beams, each pair of laser beams having dissimilar wavelengths from the other pair of laser beams. The polarization of a light beam within each pair is rotated to be orthogonal to the polarization of the other light beam in the pair so that the two beams within each pair can be distinguished from each other and thus separated from each other. The beams can then be further separated by post-polygon optics in accordance with wavelength characteristics of the light beams. This configuration produces a raster output scanner with four beams that only requires the beams to have two dissimilar wavelengths.

The four laser beams 114, 116, 118 and 120 are deflected by polygon 112. The laser beams 116 and 118 comprise a first pair of beams having a first wavelength and laser beams 114 and 120 comprise a second pair of beams having a second wavelength. One beam within each pair of beams has an orthogonal polarization to the other beam within each pair of beams (for example, beams 114 and 116 may have a polarization P, while beams 118 and 120 have a polarization S, beams 116 and 118 have a wavelength of 645 nm and beams 114 and 120 may have a wavelength of 825 nm).

After deflection by polygon 112 and passing through correction optics 30, the beams 114, 116, 118 and 120 are reflected by mirror 60 onto motion compensation optics 62, which corrects for polygon wobble, for example. The beams 114, 116, 118 and 120 are then reflected onto mirror 64 and into polarized beam separator 66. Polarized beam separator 66 separates the beams by polarization by reflecting beams 114 and 116, which have a first polarization, and passing beams 118 and 120, which have a second polarization. The polarized beam separator 66 can be, for example, a prism or have a polarization selective multiple layer film so that it will pass or reflect the beams according to their polarization. The beams 114, 116, 118 and 120 are directed to the four photoreceptors 10, 8, 6, and 4, as described above in connection with FIG. 1. Similar to the printing device shown in FIG. 1, the printing device shown in FIG. 2 must have a laser source that generates closely bundled laser beams to avoid off-axis distortion effects as the beams propagate through the optics.

The embodiment above described a particular sequence for separating the four bundled beams consisting of two orthogonally polarized beams at a given wavelength, $\lambda_1$, and two more orthogonally polarized beams at a second wavelength $\lambda_2$. These four beams can be designated as ($\lambda_1$ P), ($\lambda_1$ S), ($\lambda_2$ P) and ($\lambda_2$ S). In the sequence described above the beams are split first by polarization at element 66 into two pairs of beams ($\lambda_1$ P), ($\lambda_2$ P) as one pair and ($\lambda_1$ S), ($\lambda_2$ S) as the second pair. These two pairs are then split by wavelength at elements 36 and 44 into four separated beams. An alternative approach could also be used wherein the sequence for separating the four bundled beams would be to split first by wavelength and second by polarization. Therefore the four beams would be split first into 2 pairs at element 66 with ($\lambda_1$ P), ($\lambda_1$ S), as one pair and ($\lambda_2$ P), ($\lambda_2$ S) as the second pair. These two pairs would then be split by polarization at elements 36 and 44 into four separated beams.

It is desired to produce a laser array so that beams produced by the laser elements are closely spaced, having offsets spaced along the sagittal direction (i.e., parallel to the axis about which a polygon mirror rotates). In a particularly desirable embodiment, the laser array produces beams with offset of 50 μm.

It is possible to produce a laser array that generates four laser beams using completely monolithic, side-by-side regrowth techniques. This would require three regrowing steps to achieve four distinct laser sources on the same substrate. However, a laser array produced by such side-by-side regrowth creates yield loss at each step, which leads to a relatively high overall yield loss. There would be a reduction of yield associated with each additional laser source because a separate regrowth step would be required to produce each additional laser source. Thus, a four laser source array would require three regrowth steps, resulting in a relatively low yield. On the other hand fabricating a four laser source array by purely hybrid techniques using four separate laser diode dies is very labor intensive. It also is difficult to achieve the desired minimal spacing between laser sources when using four separate laser dies.

The present invention reduces yield losses producing a laser array having four laser sources by combining hybrid assembly techniques with monolithic techniques to create a laser array, as will be discussed below.

Figure 3:
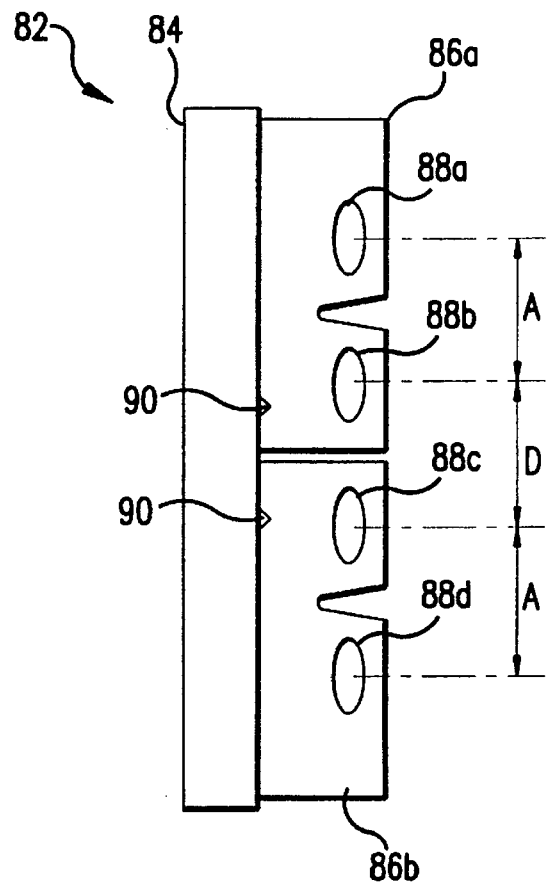
FIG. 3 is a simplified, schematic front view showing laser beam chips mounted on a submount and in accordance with the principles of the present invention and that is suitable for use in the ROS systems illustrated in FIGS. 1 and 2.

FIG. 3 is a front view of a laser array 82 according to a preferred embodiment of the present invention. The laser array 82 includes a base (e.g., a heat sink) 84 and two monolithic laser beam dies 86a, 86b mounted on the base 84. Each of the laser beam dies has two aligned light-emitting stripes that produce laser beams each of which may have a different wavelength but the same polarization. Alternatively, a first pair of the laser elements may output laser beams 88a and 88b having a first wavelength λ1, and a second pair of laser elements may output laser beams 88c and 88d having a second wavelength λ2. In this latter embodiment, the separate beams produced by each pair of laser elements will be cross-polarized, so that the beams may be separated by wavelength and polarization.

Die 86a includes stripes emitting beams 88a and 88b, while die 86b includes stripes emitting beams 88c and 88d. The laser stripes on each of the laser beam dies are separated by a predetermined distance A. In a preferred embodiment, the distance A is about 50 μm. Each of the laser beam dies 86a, 86b can be fabricated by known side-by-side regrowth and subsequent processing techniques or by other techniques so as to have the desired offset between the laser stripes. When the laser beam dies 86a, 86b are mounted on the base 84, they must be positioned so that adjacent laser stripes on different laser beam dies have an offset D, which preferably is equal to offset A, so that each of the laser stripes emitting beams 88a–88d are equally offset.

The desired offset D may be achieved by accurate placement of the individual laser beam dies on the base 84 and by placement of one of the stripes closely adjacent to a side of its die. For example, the stripe emitting beam 88b is closely adjacent to a side of die 86a, while the stripe emitting beam 88c is closely adjacent to a side of die 86b. Accurate placement of a laser stripe relative to a side of a die may be achieved in several ways disclosed in Kovacs et al., U.S. patent application Ser. No. 08/156,222, the disclosure of which is incorporated by reference herein. As disclosed in U.S. patent application Ser. No. 08/156,222, the single dies may be diced from a wafer of laser stripes constructed by well known semiconductor fabrication techniques. Accurate positioning of the stripe relative to the side of the die is generally accomplished by dicing the die along a line which is scribe initiated at an accurately determined distance relative to the laser stripe.

As disclosed in U.S. patent application Ser. No. 08/156, 222, proper placement of laser beam dies 86a and 86b on the base 84 to achieve the desired offset D may be accomplished by providing each of the laser beam dies with a detectable feature and mounting the laser beam dies 86a and 86b on the base 84 so that there is a predetermined distance between the detectable features. The detectable features may include the laser stripes, a groove 90 etched in each of the laser beam dies 86a or 86b or a side edge of each of the laser beam dies. Additionally, close proximity cleaving of the laser beam dies so that the edgemost laser stripe is close to the edge of the die may be accomplished as disclosed in U.S. patent application Ser. No. 08/156,222. A scribe mark is made at a point a given distance from the laser stripe and slight pressure is applied at the mark to induce a cleave break that will maintain the proper distance parallel to the axis of the laser stripe to within atomic tolerances. This close proximity cleaving is generally performed after the side-by-side regrowth. Regrowth after cleaving is impractical due to the need to place many small diced laser dies back into the reactor for regrowth and then to process laser stripes on these many small dies. The multiple handling steps for these many small dies becomes virtually impossible.

Figure 4:
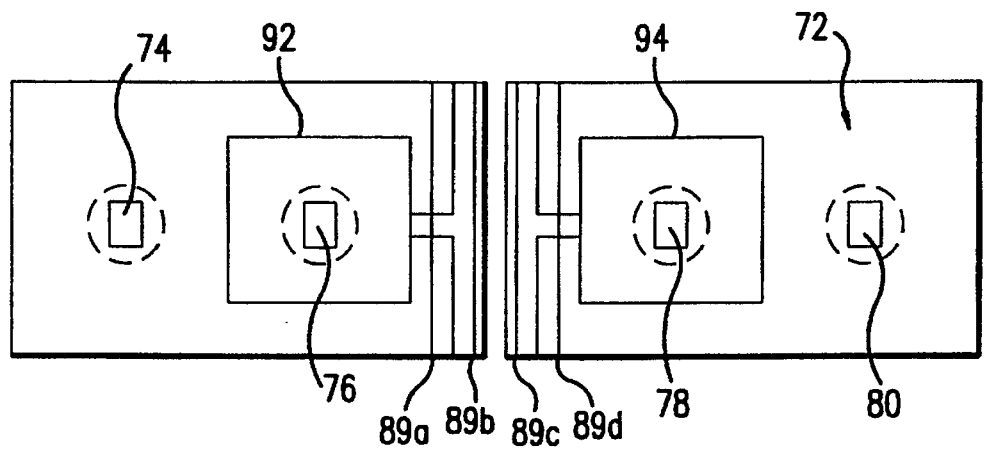
FIG. 4 is a simplified, schematic view showing wire bonding pads for the laser stripes in a preferred embodiment of the present invention.

FIG. 4 illustrates the wire bonding of the closely spaced laser stripes according to a preferred embodiment of the present invention. Because the distance between the laser stripes is very small (e.g., 50 µm) in accordance with the previously described preferred embodiment of the present invention, the maximum distance available between an edgemost laser stripe and the edge of the die or between the laser stripe and the region separating it from the other laser stripe located on the same chip will also be very small (e.g., approximately 20 µm). A typical ball bond made from a one mil gold wire results in an approximately 3 mil ball. The small available space (20 µm) is insufficient for conventional ball bonding. Therefore, the present invention uses a specialized metallization pattern as shown in FIG. 4.

In FIG. 4, the laser stripes 89a–89d are connected to respective ball bonding locations 74, 76, 78 and 80 by a metallization pattern 72. Lines 92 and 94 represent breaks in the metallization pattern 72 so that individual laser stripes 89a–89d are each connected to a respective one of the ball bonding areas 74, 76, 78 and 80. Individual wire bonds are then attached to each of the ball bonding locations 74, 76, 78 and 80 to connect a power source and control devices (not shown) to the laser stripes. Specifically, pad 74 is attached to stripe 89a, pad 76 is attached to stripe 89b, pad 78 is attached to stripe 89c and pad 80 is attached to stripe 89d. While the metal connection between pad 76 and laser stripe 89b does cross laser stripe 89a it does so over a very narrow bridge. While the typical length of the laser stripes is ~30 mils the bridging connection has a width of ~0.5 mil. Since any current injected from this bridge into laser stripe 89a affects only a small fraction of the stripe the operation of laser 89b from pad 76 has a negligible effect on the operation of laser 89a. Similarly the operation of laser 89c through pad 78 has a negligible effect on the operation of laser 89d. Therefore the four pad contact system shown in FIG. 4 allows essentially completely independent operation of lasers 89a, 89b, 89c and 89d.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. An array of laser emitting sources for a printing device, comprising:

a base;

a plurality of monolithic laser beam dies mounted on the base, each of the monolithic laser beam dies having two laser stripes that produce a first laser beam and a second laser beam, respectively, wherein the first laser beam of each of the dies has one of a different wavelength and a different polarization from the second laser beam, the two laser stripes being simultaneously operable.

2. The array of claim 1, wherein the two laser stripes of each of the monolithic laser beam dies are separated by a first predetermined distance.

3. The array of claim 2, wherein the first predetermined distance is approximately 50 µm.

4. The array of claim 2, wherein the plurality of monolithic laser beam dies are mounted on the base so that adjacent laser stripes on adjacent monolithic laser beam dies are separated by a second predetermined distance.

5. The array of claim 4, wherein the first and the second predetermined distances are approximately 50 µm.

6. The array of claim 1, wherein each of the monolithic laser beam dies has a detectable feature, and the monolithic laser beam dies are mounted on the base such that there is a predetermined distance between the detectable features of adjacent monolithic laser beam dies.

7. The array of claim 6, wherein the detectable feature comprises one of the two laser stripes on each of the adjacent monolithic laser beam dies.

8. The array of claim 6, wherein the detectable feature comprises a groove etched in each of the monolithic laser beam dies.

9. The array of claim 6, wherein the detectable feature comprises a side edge of each of the monolithic laser beam dies.

10. The array of claim 1, further comprising a metallization pattern on each of the monolithic laser beam dies, the metallization pattern connecting each of the laser stripes to one of a plurality of ball bonding locations.

11. The array of claim 1, wherein said plurality of monolithic laser beam dies comprises a first monolithic laser beam die having a first laser stripe and a second laser stripe, and a second monolithic laser beam die having a third laser stripe and a fourth laser stripe.

12. An array of laser emitting sources comprising:

a base;

a first monolithic laser beam die having a first laser stripe and a second laser stripe that produce first and second laser beams, respectively;

a second monolithic laser beam die having a third laser stripe and a fourth laser stripe that produce third and fourth laser beams, respectively;

a first pair of said first, second, third and fourth laser beams having a first polarization;

a second pair of said first, second, third and fourth laser beams having a second polarization orthogonal to said first polarization;

each of the laser beams in each of said first and second pairs having a wavelength that is substantially the same as one of the laser beams in the other pair, but different from the other laser beam in said first and second pairs, the first, second, third and fourth laser stripes being simultaneously operable.

13. The array of claim 12, wherein the first and second monolithic laser beam dies are mounted on the base such that there is a predetermined distance between adjacent laser stripes on said first and second monolithic laser beam dies.

14. The array of claim 13, wherein the predetermined distance is approximately 50 μm.

15. A method of forming an array of laser emitting sources comprising the steps of:

forming a plurality of monolithic laser beam dies, each of the monolithic laser beam dies having a first laser stripe and a second laser strip for producing a first laser beam and a second laser beam, respectively, wherein the first laser beam of each of the dies has one of a different wavelength and a different polarization from the second laser beam,; and mounting the plurality of monolithic laser beam dies on a base so that adjacent laser stripes are separated by a first predetermined distance, the first laser stripe and the second laser stripe being simultaneously operable.

16. The method of claim 15, wherein the first predetermined distance is approximately 50 μm.

17. The method of claim 15, wherein the step of mounting the plurality of monolithic laser beam dies on the base further comprises the step of creating a detectable feature on each of the monolithic laser beam dies, the detectable feature having a predetermined spacing from at least one of the first laser stripe and the second laser stripe.

18. The method of claim 17, wherein the detectable feature comprises one of the first laser stripe and the second laser stripe.

19. The method of claim 17, wherein the detectable feature comprises a groove located in each of the monolithic laser beam dies.

20. The method of claim 17, wherein the detectable feature comprises a side edge of each of the monolithic laser beam dies.

21. The method of claim 15, further comprising the step of forming a metallization pattern on each of the monolithic laser beam dies, the metallization pattern connecting each of the laser stripes to one of a plurality of ball bonding locations.

22. The method of claim 15, wherein each of the monolithic laser beam dies are cut from a wafer and each of the laser beam dies comprises a first laser structure and a second laser structure, further comprising the step of growing the second laser structure beside an already grown first laser structure.

* * * * *